United States Patent [19]

Shimoyama et al.

[11] Patent Number: 5,145,807
[45] Date of Patent: Sep. 8, 1992

[54] METHOD OF MAKING SEMICONDUCTOR LASER DEVICES

[75] Inventors: Kenji Shimoyama; Hideki Gotoh, both of Ushiku, Japan

[73] Assignee: Mitsubishi Kasei Corporation, Tokyo, Japan

[21] Appl. No.: 545,794

[22] Filed: Jun. 29, 1990

Related U.S. Application Data

[62] Division of Ser. No. 349,614, May 10, 1989, Pat. No. 4,969,151.

[30] Foreign Application Priority Data

May 11, 1988 [JP] Japan .................... 63-113898

[51] Int. Cl.⁵ .................................. H01L 21/18
[52] U.S. Cl. .................................. 437/129; 437/133; 148/DIG. 95
[58] Field of Search ............... 372/46, 47; 437/81, 437/129, 126, 946, 133; 156/610, 613; 148/DIG. 95

[56] References Cited

U.S. PATENT DOCUMENTS

| | | | |
|---|---|---|---|
| 4,503,540 | 5/1985 | Nakashima et al. | 372/47 |
| 4,648,940 | 3/1991 | Menigaux et al. | 437/129 |
| 4,663,761 | 5/1987 | Barnard et al. | 372/45 |
| 4,756,792 | 7/1988 | Fujita et al. | 156/610 |
| 4,808,551 | 2/1989 | Mori et al. | 437/81 |
| 4,864,581 | 9/1989 | Nelson et al. | 437/129 |
| 4,891,093 | 1/1990 | Smith | 437/90 |
| 4,935,381 | 6/1990 | Speckman et al. | 437/81 |

FOREIGN PATENT DOCUMENTS

| | | | |
|---|---|---|---|
| 0050789 | 3/1983 | Japan | 437/129 |
| 0127392 | 7/1983 | Japan | 437/129 |
| 60-235491 | 11/1985 | Japan | 372/46 |
| 0222433 | 9/1989 | Japan | 437/129 |

Primary Examiner—Mary Wilczewski
Attorney, Agent, or Firm—Armstrong & Kubovcik

[57] ABSTRACT

Carrier injection layers are formed on an $Al_xGa_{1-x}As$ clad layer of high resistance by embedding and regrowth with the use of crystal growth processes such as MO-VPE or MO-MBE where material supply sources are all provided by gas sources, whereby it is not required to mesa-etch embedding regions to a depth reaching a substrate. The formation of any separate blocking layer is dispensed with, any possible influence of the substrate is eliminated, and the time constant is decreased by decreasing the inter-electrode capacity.

4 Claims, 2 Drawing Sheets

METHOD OF MAKING SEMICONDUCTOR LASER DEVICES

This is a division, of application Ser. No. 349,614 filed May 10, 1989, now U.S. Pat. No. 4,969,151.

BACKGROUND OF THE INVENTION

The present invention relates to a semiconductor laser device and, more particularly, an embedded type of semiconductor laser device and a process for making such a device.

FIG. 2 illustrates a typical structure of a conventional semiconductor laser device in which the transverse mode is controlled by the provision of an embedded layer. In FIG. 2, reference numeral 22 stands for a semi-insulating substrate, 23 a lower clad layer, 24 an active layer, 25 an upper clad layer, 26 a p-type carrier injection layer, 27 a blocking layer, 28 an n-type carrier injection layer, and 29 and 30 electrodes.

The laser device shown in FIG. 2 is of the structure that carriers are transversely injected in the active layer. The lower clad layer 23 of $Al_xGa_{1-x}As$, the active layer 24 of $Al_yGa_{1-y}As$ and the upper clad layer 25 of $Al_xGa_{1-x}As$, provided that $x>y$, are laminated on the semi-insulating substrate 22 of GaAs in that order. The active layer 24 may be not only of the above structure but also of a singlet or multiplet quantum well structure or a multiplet active layer structure thereof.

FIG. 3 is a view for illustrating a conventional multiplet quantum well structure.

When the thickness of the active layer is 20 nm or below, electrons occupy only limited levels due to the resulting quantum effect. For that reason, transition occurs on the thus limited levels so that the efficiency of radiation is increased, resulting in a decrease in threshold value currents. The multiplet quantum well structure makes use of such phenomena. As illustrated, a very small thickness is given to an active layer 33 formed between upper and lower clad layers 31 and 32, while barrier layers 34 of AlGaAs and quantum wells 35 of GaAs are repeatedly formed. To effectively confine light in the active layer, the mixed crystal ratio of Al of the barrier layers is smaller than that of the clad layers. Usually, certain limitations are imposed upon the number of wells, the thickness of barrier layers and the mixed crystal ratio of barrier layers (generally, the number of wells is 5, the thickness of barrier layers is 6 to 20 nm and the Al to As ratio of barrier layers is 0.2 to 0.3). This is because in the case of the structure where currents flow in the longitudinal direction, there is a change in the injection of carriers in the upper and lower quantum wells. However, the transverse junction type laser device is freed of such limitations. Thus, an energy band structure of a conduction band Ec and a valence band Ev is obtained, as illustrated. Carriers are injected in the quantum wells, so that radiation takes place due to the recombination of electrons with holes, and the coherency of output light is maintained by reason that the quantum wells interact. It is noted that the reason why the space between the clad layer and the first quantum wells is increased is to prevent the similarity of other quantum wells to the energy band structure from deteriorating because of the energy level of the clad layer being high. By using the quantum wells for the active layer, it is also possible to obtain a very decreased inter-electrode capacity.

Usually, regions for embedding p- and n-type carrier injection layers 26 and 28 are formed by the LPE (liquid-phase epitaxial) technique. A blocking layer 27 is provided to prevent any leak from occurring between the p- and n-type carrier injection layers 2 through a substrate.

However, difficulty is involved in the formation of the regions for embedding carrier injection layers by the LPE technique, since a melt tends to be oxidized to form a surface oxide film on $Al_xGa_{1-x}As$, if the value of x is increased as is the case with the clad layers of semiconductor laser devices. For that reason, it has been required to previously mesa-etch a region to a depth reaching the GaAs substrate 22 and embed a carrier layer in the GaAs substrate 22.

When currents flow in the transverse direction in this structure, leak currents occur through the substrate. In order to prevent this, it is required that the blocking layer 27 be provided in either one of the embedding regions (in FIG. 2, a p-type AlGaAs layer having a molar Al to As ratio of 0.2 to 0.4 be provided in the lower portion of the n-side carrier injection layer 27). It is difficult to form a blocking layer having a uniformly controlled large area, as experienced with a 2- or 3-inch substrate, thus leading to a lowering of device process yields.

SUMMARY OF THE INVENTION

The present invention has been accomplished to solve the above problems. Thus, an object of the present invention is to make an embedded type of semiconductor laser device by embedding and regrowing carrier injection layers on $Al_xGa_{1-x}As$ wherein $0.3 \leq X \leq 0.85$ with the use of crystal growth processes capable of growing ternary or more multiple system crystals containing aluminium such as the MO-VPE (organic metal vapor-phase epitaxial) technique or the MO-MBE (organic metal molecular beam epitaxial) technique.

In order to achieve the above object, a process for making semiconductor laser devices according to the present invention, which comprises a semi-insulating substrate; a mesa-form double hetero structure in which an active layer of $Al_yGa_{1-y}As$ is sandwiched between upper and lower clad layers, each having a high specific resistance and being formed of $Al_xGa_{1-x}As$, provided that $0.3 \leq X \leq 0.85$, $0 \leq y \leq 0.45$ and $0 \leq y < x$; n- and p-type carrier injection layers of $Al_zGa_{1-z}As$ formed on the lower clad layer of $Al_xGa_{1-x}As$ by embedding and re-growth and between which said double hetero structure is interposed, provided that $y < z \leq x$; and n$^+$- and p$^+$-type contact layers having electrodes to be formed on their surfaces, is characterized by embedding and growing said carrier injection layers on $Al_xGa_{1-x}As$ wherein $0.3 \leq X \leq 0.85$ with crystal growth processes such as MO-VPE or MO-MBE where material supply sources are all provided by gas sources.

DESCRIPTION OF THE PREFERRED EMBODIMENT

Figure 1:
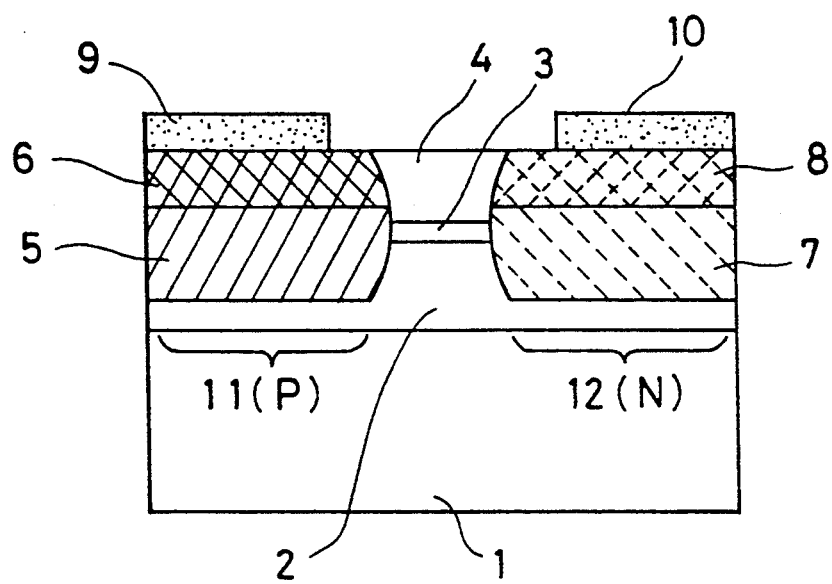
FIG. 1 is a view showing a structure of the semiconductor laser device according to the present invention.

Referring now to FIG. 1, there is shown a structure of the semiconductor laser device according to the present invention, wherein reference numeral 1 stands for a semi-insulating substrate, 2 a lower clad layer, 3 an active layer, 4 an upper clad layer, 5 a p-type carrier injection layer, 6 a p+-contact layer, 7 an n-type carrier injection layer, 8 an n+-contact layer and 9 and 10 electrodes.

Figure 2:
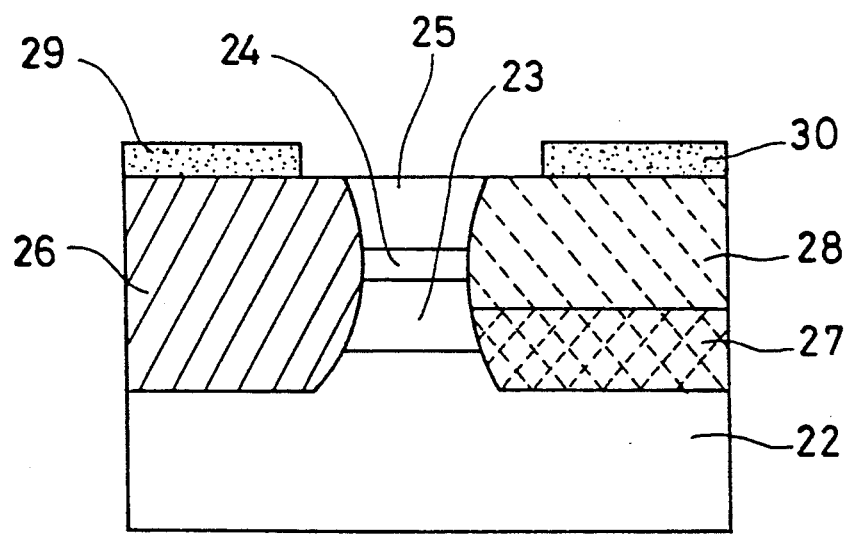
FIG. 2 is a view showing a structure of a conventional semiconductor laser device.
Figure 3:
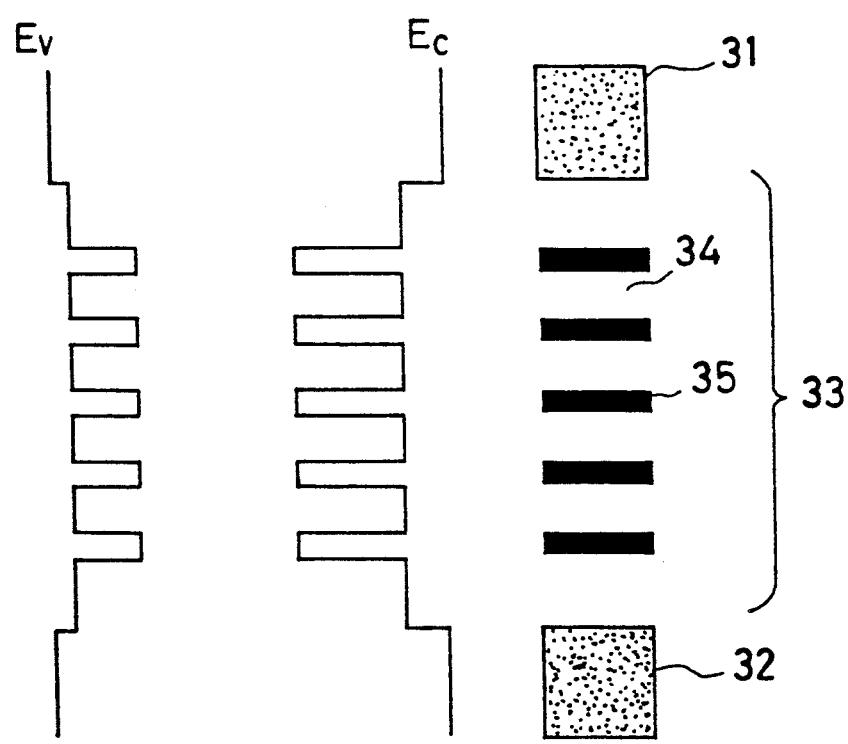
FIG. 3 is a view for illustrating a conventional multiple quantum well structure.

As is the case with the structure of FIG. 2, on the semi-insulating substrate 1 of, e.g., 0.3 mm to 0.5 mm in thickness, there is formed a double hetero (DH) structure including the $Al_yGa_{1-y}As$ active layer 3 having a thickness of 3 nm to 500 nm, preferably 10 to 300 nm, which is sandwiched between the $Al_xGa_{1-x}As$ clad layers 2 and 4, provided that $0.3 \leq x \leq 0.85$, $0 \leq y \leq 0.45$ and $0 \leq y \leq x$. The upper and lower clad layers 4 and 2 have a thickness of 0.5 to 2 $\mu$m and 1 to 5 $\mu$m, respectively. It is noted that the substrate may be any amorphous substrate of glass or any low-resistance substrate, if the vapor-phase growth of $Al_yGa_{1-y}As$ takes place thereon. It is also understood that the structure of the active layer 3 is not limited to the above type, and may be of a singlet or multiplet quantum well type. Alternatively, the active layer 3 may be formed of a laminate of two or more such active layers.

Afterwards, in order to form an embedded region in either one of the p- and n-sides as shown in FIG. 1, mesa etching is applied to halfway through the lower clad layer 2 of $Al_xGa_{1-x}As$ ($0.3 \leq x \leq 0.85$), leaving behind a portion of about 0.2 to 1 $\mu$m, to form a p-side (11) or n-side (12) carrier injection region on $Al_xGa_{1-x}As$. In this case, the carrier concentration may be about $5 \times 10^{17}$ to $2 \times 10^{18}$ cm$^{-3}$ for the p-type carrier injection layer 5, about $2 \times 10^{18}$ to $5 \times 10^{19}$ cm$^{-3}$ for the p+-contact layer 6, about $5 \times 10^{17}$ to $2 \times 10^{18}$ cm$^{-3}$ for the n-type carrier injection layer 7 and about $1 \times 10^{18}$ to $3 \times 10^{18}$ cm$^{-3}$ for the n+-contact layer 8, as measured by the Van der Pauw's method. Subsequently, the other region 12 or 11 is subjected to mesa etching and embedding growth. Regions 11 and 12 comprising the embedded layers 5, 7 and the contact layers 6, 8 are formed in this manner. In the prior art having recourse to the LPE technique, it was required to dig a region to a depth reaching the GaAs substrate because of crystal growth being made difficult due to the presence of the surface oxide film of $Al_xGa_{1-x}As$. In contrast, not only does the present invention render re-growth on $Al_xGa_{1-x}As$ possible, but it is also possible to carry out embedding and re-growth by making use of crystal growth process which allows selective growth with the use of a protective film such as $SiO_2$ or $SiN_x$, for instance, the MO-VPE or MO-MVE technique where such material supply sources as a gallium source (trimethyl gallium), an arsenic source (arsine) and an aluminium source (trimethyl aluminium) are all provided by gas sources. It is to be noted, however, that just prior to re-growth, an oxide film is removed in situ from the surface of $Al_xGa_{1-x}As$ by vapor-phase etching using HCl (hydrogen chloride), etc. to form the $Al_zGa_{1-z}As$ embedded layers 5 and 7, provided that $x \geq z > y$. At this time, the layers 5 and 7 are grown to the surface side beyond the active layer 3. Subsequently, the contact layers of p+GaAs 6 and n+GaAs 8 are formed. Finally, the electrodes 9 and 10 are formed on the contact layers by vapor-deposition.

EXAMPLES

The present invention will now be explained with reference to the following examples.

By the vacuum MO-VPE technique, 1.5-$\mu$m undoped $Al_{0.42}Ga_{0.58}As$, 0.2 $\mu$m-undoped GaAs and 1.0 $\mu$m-undoped $Al_{0.42}Ga_{0.58}As$ were grown on a semi-insulating substrate in that order at a growth temperature of 710° to 790° C. and a growth pressure of 76 Torr. An $SiN_x$ film of 1500 Å is then deposited on the surface of the substrate by PCVD (plasma chemical vapor-deposition). The $SiN_x$ film, now applied with a resist, is exposed to ultraviolet rays to pattern a one-side embedding region, and is then windowed with a hydrofluoric acid buffer solution (1HF:24NH$_4$F) followed by the removal of the resist. Thereafter, about 1.7-$\mu$m mesa etching is applied to halfway through the lower clad layer of undoped $Al_{0.42}Ga_{0.58}As$ with an aqueous etching solution containing phosphates in excess (1H$_3$PO$_4$:1-H$_2$O$_2$:3HOC$_2$H$_5$C$_2$H$_5$OH). By the vacuum MO-VPE technique, 1-$\mu$m n-(or p-)$Al_{0.32}Ga_{0.68}As$ and 0.7-$\mu$m n-(or p-)GaAs were embedded at 710° C. in that order for growth. At this time, just prior to re-growth, HCl is admitted into a reactor to remove about 0.05 to 0.2 $\mu$m of the re-grown surface layer by vapor-phase etching.

With the use of a similar process, the activated layer of GaAs (y=0) is mesa-etched to a transverse width of about 0.15 $\mu$m to form another p-(or n-)type embedding region. Afterwards, (epi-side) AuZn/Ni/Au (surface side) and (epi-side) AuZn/Ni/Au (surface side) are respectively vapor-deposited on the surfaces of the n- and p-side regions. Alternatively, in the process of making the above laser device, vapor-phase mesa etching may be carried out in place of wet etching, while a gas such as HCl is admitted in the reactor using the above protective film, immediately followed by embedding and regrowth. The thus obtained laser device was found to have superior reproducibility and succeeded in laser oscillation. However, samples not subjected to vapor-etching in the reactor just prior to growth all failed to oscillate.

The transverse junction-type of embedded hetero structure shown in FIG. 1 was continuously oscillated in the form of a quintuplet quantum well structure at normal temperature, a resonator wavelength of 160 $\mu$m, an active layer's width of 2.0 $\mu$m, an active layer's thickness of 230 nm, a barrier layer's thickness of 19 nm and a quantum well's thickness of 11 nm. As a result, output light of 1.8 mW at an oscillation wavelength of 868 to 870 nm was obtained at a threshold value current of 9.5 mA, a forward inter-electrode voltage of 34 $\Omega$ and 14 mA. For the inter-electrode capacity, a value as small as 0.042 pF (at zero bias time) was obtained.

According to the present invention as detailed above, in the laser device of the structure wherein carriers are injected in the transverse direction, the carrier injection layers are formed on the clad layers of $Al_xGa_{1-x}As$ of high resistance by embedding and regrowth with the use of crystal growth techniques such as MO-VPE or MO-MBE where material supply sources are all provided by gas sources, whereby:

(1) it is not required to perform mesa etching to a depth reaching the substrate; nor is the formation of any separate blocking layer needed;

(2) any possible influence of the substrate is eliminated;

(3) the inter-electrode capacity can be reduced, resulting in a decrease in the time constant;

(4) these devices may be used for the production of superfast response devices, e.g., photocouplers and OEIC;

(5) since these devices may be made by planar processes while electrical insulation is provided between the elements by the clad layers, they may be monolithically integrated with other electronic circuits and photocircuits; and (6) the process may be simplified because of no need of forming blocking layers, which is one cause of yield reductions.

What is claimed is:

1. A process for making an embedded semiconductor laser comprising the following steps:

a step for sequentially forming an $Al_xGa_{1-x}As$ lower cladding layer, an $Al_yGa_{1-y}As$ active layer, and an $Al_xGa_{1-x}As$ upper cladding layer (wherein $0.3 \leq x \leq 0.85$, $0 \leq y \leq 0.45$, $0 \leq y \leq x$);

a step for forming one embedded area by mesa etching to the middle of said lower cladding layer;

a step for growing one of an n-type or a p-type $Al_zGa_{1-z}As$ ($y < z \leq x$) carrier injection layer in said one embedded area using a crystal growth method selected from the group consisting of MO-VPE or MO-MBE in which all raw material supply sources are gas sources;

a step for forming another embedded area by mesa etching up to the middle of said lower cladding layer;

a step for growing the other of a p-type or an n-type $Al_zGa_{1-z}As$ carrier injection layer (wherein $y < z \leq x$) in said another embedded area using a crystal growth method selected from the group consisting of MO-VPE or MO-MBE, in which all raw material supply sources are gas sources; and a step for forming an electrode on the surface of the n-type and the p-type carrier injection layer.

2. A process for making an embedded semiconductor laser according to claim 1, wherein an oxide film on the surface of the lower cladding layer is eliminated by gas-phase etching immediately before the growth of the carrier injection layers in the embedded areas.

3. A process for making an embedded semiconductor laser as set forth in claim 2, wherein said gas-phase etching comprises using HCl.

4. A process for making an embedded semiconductor laser as set forth in claim 1, wherein said crystal growth processes take place at a temperature of 710–790 degrees centigrade and a growth pressure of 76 Torr.

* * * * *